US011201097B2

(12) United States Patent
Huang et al.

(10) Patent No.: US 11,201,097 B2
(45) Date of Patent: Dec. 14, 2021

(54) METHOD OF MANUFACTURE OF A SEMICONDUCTOR DEVICE

(71) Applicant: Taiwan Semiconductor Manufacturing Company, Ltd., Hsinchu (TW)

(72) Inventors: Kuan-Yu Huang, Taipei (TW); Chih-Wei Wu, Zhuangwei Township (TW); Li-Chung Kuo, Taipei (TW); Long Hua Lee, Taipei (TW); Sung-Hui Huang, Dongshan Township (TW); Ying-Ching Shih, Hsinchu (TW); Pai Yuan Li, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 16/569,972

(22) Filed: Sep. 13, 2019

(65) Prior Publication Data

US 2020/0006178 A1 Jan. 2, 2020

Related U.S. Application Data

(62) Division of application No. 15/869,305, filed on Jan. 12, 2018.

(Continued)

(51) Int. Cl.
*H01L 23/31* (2006.01)
*H01L 21/78* (2006.01)

(Continued)

(52) U.S. Cl.
CPC ........ *H01L 23/3128* (2013.01); *H01L 21/561* (2013.01); *H01L 21/563* (2013.01);
(Continued)

(58) Field of Classification Search
CPC ... H01L 23/3128; H01L 23/562; H01L 21/78; H01L 21/561; H01L 24/81; H01L 24/16; H01L 23/3142; H01L 23/3185; H01L 23/3114; H01L 21/563; H01L 23/3157; H01L 23/49816; H01L 23/49827; H01L 2224/16227; H01L 2224/13111;
(Continued)

(56) References Cited

U.S. PATENT DOCUMENTS 6,326,698 B1 12/2001 Akram
7,838,424 B2 11/2010 Karta et al.
(Continued)

FOREIGN PATENT DOCUMENTS

CN 101339910 A 1/2009
CN 101552244 A 10/2009
(Continued)

*Primary Examiner* — Thanh T Nguyen
(74) *Attorney, Agent, or Firm* — Slater Matsil, LLP

(57) ABSTRACT

In order to prevent cracks from occurring at the corners of semiconductor dies after the semiconductor dies have been bonded to other substrates, an opening is formed adjacent to the corners of the semiconductor dies, and the openings are filled and overfilled with a buffer material that has physical properties that are between the physical properties of the semiconductor die and an underfill material that is placed adjacent to the buffer material.

20 Claims, 17 Drawing Sheets

Related U.S. Application Data

(60) Provisional application No. 62/527,849, filed on Jun. 30, 2017.

(51) Int. Cl.
  *H01L 21/56* (2006.01)
  *H01L 23/00* (2006.01)
  *H01L 23/498* (2006.01)

(52) U.S. Cl.
  CPC .......... *H01L 21/78* (2013.01); *H01L 23/3114* (2013.01); *H01L 23/3142* (2013.01); *H01L 23/3157* (2013.01); *H01L 23/3185* (2013.01); *H01L 23/562* (2013.01); *H01L 24/16* (2013.01); *H01L 24/81* (2013.01); *H01L 23/49816* (2013.01); *H01L 23/49827* (2013.01); *H01L 24/05* (2013.01); *H01L 24/11* (2013.01); *H01L 24/13* (2013.01); *H01L 24/97* (2013.01); *H01L 2224/0401* (2013.01); *H01L 2224/0557* (2013.01); *H01L 2224/05124* (2013.01); *H01L 2224/05147* (2013.01); *H01L 2224/05184* (2013.01); *H01L 2224/06181* (2013.01); *H01L 2224/11849* (2013.01); *H01L 2224/13111* (2013.01); *H01L 2224/13139* (2013.01); *H01L 2224/13147* (2013.01); *H01L 2224/16145* (2013.01); *H01L 2224/16227* (2013.01); *H01L 2224/32145* (2013.01); *H01L 2224/32225* (2013.01); *H01L 2224/73204* (2013.01); *H01L 2224/81191* (2013.01); *H01L 2224/81815* (2013.01); *H01L 2224/92125* (2013.01); *H01L 2224/94* (2013.01); *H01L 2924/10156* (2013.01); *H01L 2924/15311* (2013.01); *H01L 2924/3512* (2013.01)

(58) Field of Classification Search
  CPC . H01L 2224/05124; H01L 2224/05147; H01L 2224/05184; H01L 2224/0401; H01L 24/05; H01L 24/13; H01L 2224/13139; H01L 2224/13147; H01L 2224/11849; H01L 24/11; H01L 2224/81191; H01L 2224/81815; H01L 24/97; H01L 2924/3512

See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 2001/0051392 A1 | 12/2001 | Akram |
| 2008/0006900 A1* | 1/2008 | Chan ................ H01L 23/3121 257/499 |
| 2009/0011543 A1 | 1/2009 | Karta et al. |
| 2009/0160035 A1 | 6/2009 | Suzuki et al. |
| 2012/0100693 A1 | 4/2012 | Itoh et al. |
| 2012/0119346 A1 | 5/2012 | Im et al. |
| 2012/0119354 A1* | 5/2012 | Tsai ................ H01L 21/563 257/737 |
| 2012/0133379 A1 | 5/2012 | Chou et al. |
| 2015/0214077 A1 | 7/2015 | Tsai et al. |
| 2015/0325536 A1 | 11/2015 | Jeng et al. |
| 2015/0357256 A1* | 12/2015 | Suthiwongsunthorn ................ H01L 21/561 257/734 |
| 2017/0263544 A1 | 9/2017 | Hiner et al. |
| 2018/0350754 A1 | 12/2018 | Huang et al. |

FOREIGN PATENT DOCUMENTS

| | | |
|---|---|---|
| CN | 105789063 A | 7/2016 |
| JP | H04192421 A | 7/1992 |
| JP | 2007335424 A | 12/2007 |
| JP | 2012028497 A | 2/2012 |
| KR | 20100030500 A | 3/2010 |

\* cited by examiner

METHOD OF MANUFACTURE OF A SEMICONDUCTOR DEVICE

PRIORITY CLAIM AND CROSS-REFERENCE

This application is a division of U.S. patent application Ser. No. 15/869,305, filed on Jan. 12, 2018, which claims the benefit of U.S. Provisional Application No. 62/527,849, filed on Jun. 30, 2017, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., semiconductor dies, chips, substrates, etc.) by continual reductions in device size as well as reductions in the spaces between the devices, which allow more components to be integrated into a given volume. However, as the sizes are reduced, additional problems arise with how the components are bonded and operate, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
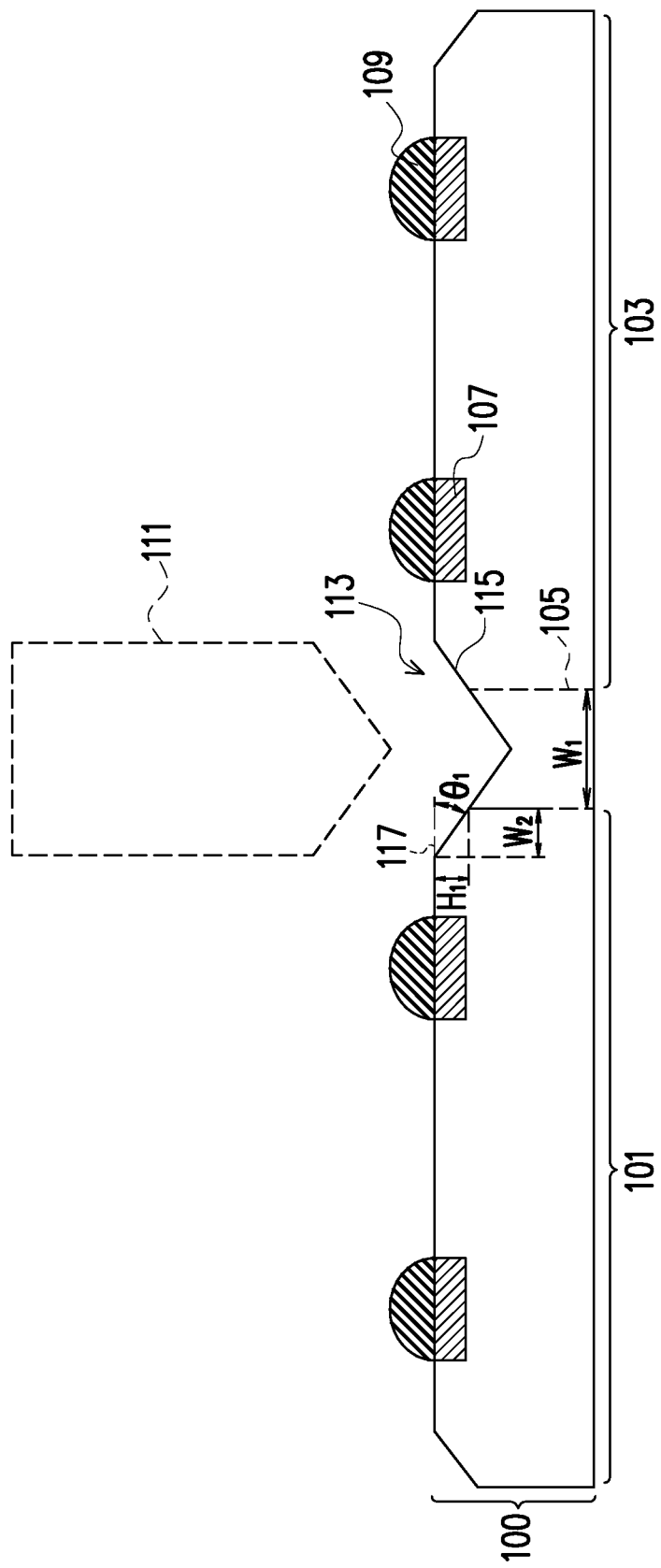
FIG. 1 illustrates a wafer with a first semiconductor device and a second semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below with reference to semiconductor devices in a chip on wafer on substrate (CoWoS) configuration. However, this is intended to be illustrative and is not intended to be limiting. Rather, the ideas embodied herein may be used in a wide variety of configurations.

With reference now to FIG. 1, there is illustrated a wafer 100 with a first semiconductor die 101 and a second semiconductor die 103 formed within and over the wafer 100. In an embodiment the first semiconductor die 101 and the second semiconductor die 103 are formed within the wafer 100 separated by a scribe region (represented in FIG. 1 by the dashed line labeled 105) along which the wafer 100 will be separated to form the individual ones of the first semiconductor die 101 and the second semiconductor die 103. In an embodiment the wafer 100 (and, as such, the first semiconductor die 101 and the second semiconductor die 103) may comprise a first substrate, first active devices, metallization layers (not separately illustrated in FIG. 1), contact pads 107, and first external connections 109. In an embodiment the first substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as transistors, capacitors, resistors, inductors and the like that may be used to generate the desired structural and functional parts of the design for the first semiconductor die 101 and the second semiconductor die 103. The first active devices may be formed using any suitable methods either within or else on the first substrate.

The metallization layers are formed over the first substrate and the first active devices and are designed to connect the various first active devices to form functional circuitry for both the first semiconductor die 101 and the second semiconductor die 103. In an embodiment the metallization layers are formed of alternating layers of dielectric and conductive material and may be formed through any suitable process (such as deposition, damascene, dual damascene, etc.). In an embodiment there may be four layers of metallization separated from the first substrate by at least one interlayer dielectric layer (ILD), but the precise number of metallization layers is dependent upon the design of the first semiconductor die 101 and the second semiconductor die 103.

The contact pads 107 are formed in order to provide external contacts for the metallization layers and the first active devices. In an embodiment the contact pads 107 are formed of a conductive material such as aluminum, although other suitable materials, such as copper, tungsten, or the like, may alternatively be utilized. The contact pads 107 may be formed using a process such as CVD or PVD, although other suitable materials and methods may alternatively be utilized. Once the material for the contact pads 107 has been deposited, the material may be shaped into the contact pads 107 using, e.g., a photolithographic masking and etching process.

The first external connections 109 may be contact bumps such as controlled collapse chip connection (C4) bumps, ball grid array bumps, or microbumps and may comprise a material such as tin, or other suitable materials, such as silver or copper. In an embodiment in which the first external connections 203 are tin solder bumps, the first external connections 109 may be formed by initially forming a layer of tin through any suitable method such as evaporation, electroplating, printing, solder transfer, ball placement, etc, to a thickness of about 100 μm. Once a layer of tin has been formed on the structure, a reflow is performed in order to shape the material into the desired bump shapes.

However, while solder bumps have been described as one embodiment of the first external connections 109, this description is intended to be illustrative and is not intended to be limiting. Rather, any suitable connective structures, such as conductive pillars (e.g., copper pillars) may also be utilized. All such structures are fully intended to be included within the scope of the embodiments.

The scribe region 105 is formed by not placing functional structures (such as the first active devices) into the area intended for the scribe regions 105. Other structures, such as test pads or dummy metals used for planarization, could be placed into the scribe region 105, but would not be necessary for the functioning of the first semiconductor die 101 or the second semiconductor die 103 once the first semiconductor die 101 and the second semiconductor die 103 have been separated from each other. The scribe regions 105 may be formed to have a first width $W_1$ of between about 10 μm and about 200 μm, such as about 80 μm.

Once the first external connections 109 have been formed or otherwise placed on the contact pads 107, a first singulation process (represented in FIG. 1 by the dashed box labeled 111) may be performed to create a first opening 113 within the wafer 100 over the scribe region 105 and at least partially within both the first semiconductor die 101 and the second semiconductor die 103. In an embodiment the first singulation process 111 may be performed by using a saw blade to slice part of the way, but not all of the way, through the wafer 100. However, any suitable method of performing the first singulation process 111 may be utilized.

Additionally, the saw blade may be chosen or made such that the saw blade has an angled edge which, when used to saw the wafer 100, will form a beveled edge 115 along both the first semiconductor die 101 and the second semiconductor die 103, although any other suitable method of forming the beveled edge 115 may also be utilized. In an embodiment the beveled edge 115 extends from a top surface of the first semiconductor die 101 towards the scribe region 105. In an embodiment the beveled edge 115 may be formed to have a first angle $\theta_1$ from the top surface of the first semiconductor die 101 of between about 20° and about 45°. However, any suitable angle may be utilized.

Additionally, by forming the beveled edge 115 within the first semiconductor die 101, there is formed a second opening (represented within FIG. 1 by the dashed box labeled 117) within the first semiconductor die 101 where the first singulation process 111 removes material from the first semiconductor die 101. In an embodiment the second opening 117 (within the first opening 113) may have a second width $W_2$ of between about 20 μm and about 200 μm, such as about 100 μm. Additionally, the second opening 117 may also have a first height $H_1$ of between about 20 μm and about 200 μm, such as about 100 μm. However, any suitable dimensions may be utilized.

Figure 2A:
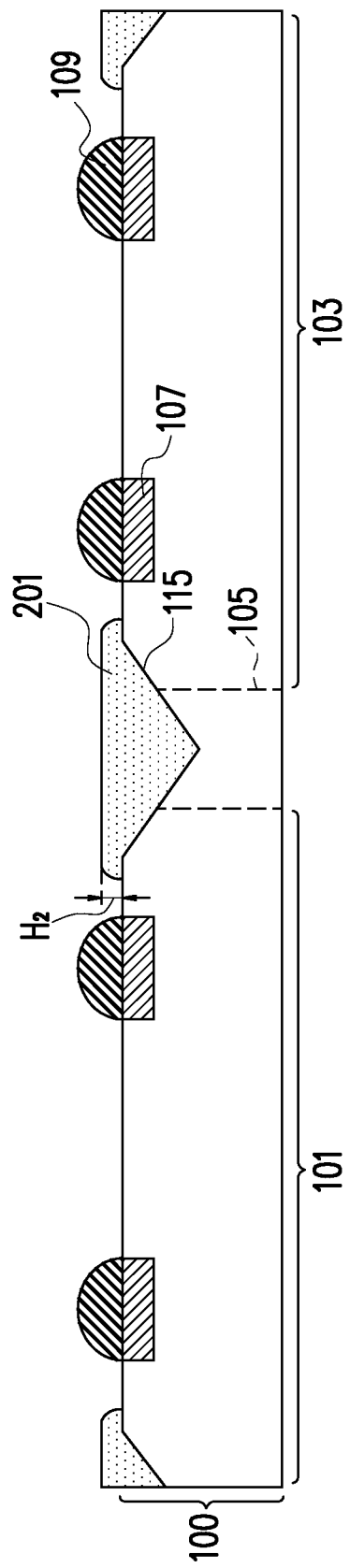
FIGS. 2A-2B illustrate a placement of a buffer material in accordance with some embodiments.

FIG. 2A illustrates a placement of a buffer material 201 within the first opening 113 and at least partially over the first semiconductor die 101 and the second semiconductor die 103. The buffer material 201 may be dispensed into the first opening 113 and over portions of the first semiconductor die 101 and the second semiconductor die 103 in a liquid or at least partially flowable form using, e.g., a dispensing tool.

In an embodiment the buffer material 201 is a material that will act as a buffer between the materials of the first semiconductor die 101 (e.g., a major material of the first semiconductor die 101 such as the silicon material of the semiconductor substrate) and an underfill material 501 (not illustrated in FIG. 2 but illustrated and described below with respect to FIG. 5). As such, in order to act as a buffer, the buffer material 201, in some embodiments, has material properties which have magnitudes that are between the magnitudes of the material properties of the first semiconductor die 101 and the underfill material 501.

For example, in some embodiments the buffer material 201 may be a material which has a first Young's modulus that is between a second Young's modulus of the first substrate (within the first semiconductor die 101) and a third Young's modulus of the underfill material 501. In additional embodiments, the buffer material 201 may also have a first coefficient of thermal expansion (CTE) that has a value between a second CTE of the first substrate (within the first semiconductor die 101) and a third CTE of the underfill material 501.

In a particular embodiment the first substrate (within the first semiconductor die 101) is silicon with a Young's modulus of 160 GPa and a CTE of 2.6 $\mu m*m^{-1}*K^{-1}$. Additionally, the underfill material 501 is a polymer such as epoxy, with a Young's modulus of 11 GPa and a CTE of 23

μm*m⁻¹*K⁻¹. In such an embodiment the buffer material 201 may be a material such as epoxy, acrylic, or PU, which has a Young's modulus of 15 GPa (between the Young's modulus of silicon and the underfill material 501) and a CTE of 9 μm*m⁻¹*K⁻¹ (between the CTE of silicon and the underfill material 501). However, any suitable material may be utilized.

Figure 2B:
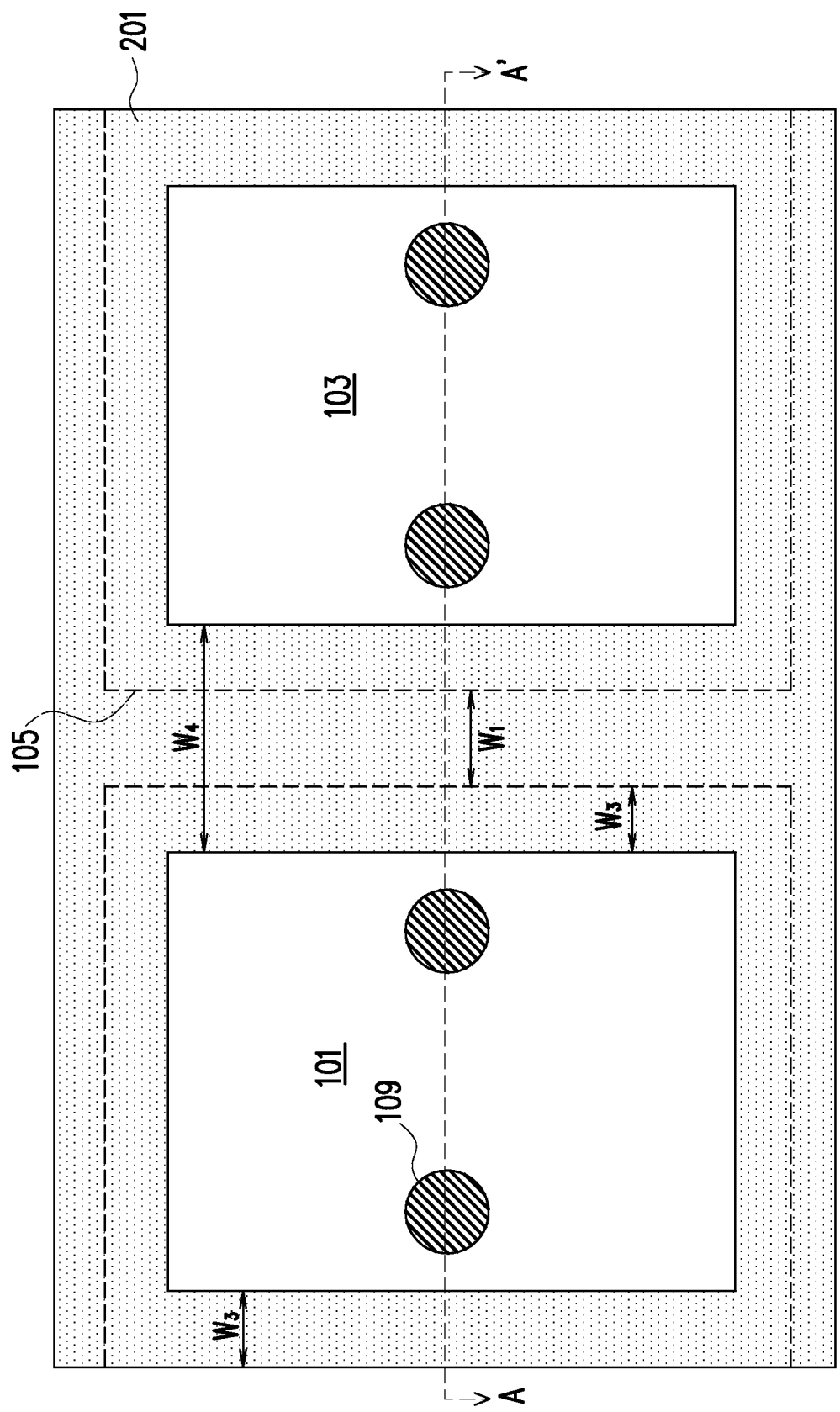

FIG. 2B illustrates a top down view of the first semiconductor die 101, the second semiconductor die 103, at least part of the scribe region 105 surrounding the first semiconductor die 101 and the second semiconductor die 103, and the buffer material 201, with FIG. 2A being a cross-section view of FIG. 2B along line A-A'. In an embodiment the buffer material 201 may be dispensed to surround an outer edge of the first semiconductor die 101 and the second semiconductor die 103 without extending across the first semiconductor die 101 and the second semiconductor die 103. For example, the buffer material 201 may be in a liquid or flowable form and placed around the outer edge of the first semiconductor die 101 and the second semiconductor die 103 using, e.g., a dispensing tool, although any suitable method of dispensing or otherwise placing the buffer material 201 may be utilized.

In the embodiment in which the buffer material 201 is dispensed around the outside edge of the first semiconductor die 101 and the second semiconductor die 103, the buffer material 201 may be formed to have a third width $W_3$ from the edge of the scribe region 105 towards the center of the first semiconductor die 101 of between about 100 μm and about 200 μm, such as about 150 μm. Additionally, the buffer material 201 may maintain the third width $W_3$ all the way around the outside edge of the first semiconductor die 101. As such, the buffer material 201 over the first semiconductor die 101 will have a total width along line A-A' of double the third width $W_3$, or between about 20 μm and about 200 μm, such as about 50 μm. However, any suitable width may be utilized.

Additionally, the buffer material 201 may be dispensed to continuously extend from the first semiconductor die 101, over the scribe region 105, and over the second semiconductor die 103. In this embodiment the buffer material 201 may have a fourth width $W_4$ of twice the third width $W_3$ (to include the widths of the buffer material 201 over both the first semiconductor die 101 and the second semiconductor die 103) as well as the first width $W_1$ of the scribe region 105. As such, the buffer material 201 may have the fourth width $W_4$ of between about 40 μm and about 400 μm, such as about 130 μm. However, any suitable dimensions may be utilized.

Returning now to FIG. 2A, the buffer material 201 may also be dispensed to a second height $H_2$ over the top surface of the first semiconductor die 101. In an embodiment the second height $H_2$ is less than an eventual stand-off height $H_{so}$ between the first semiconductor die 101 and a second substrate 401 (not illustrated in FIG. 2A but illustrated and discussed below with respect to FIG. 4). For example, in an embodiment the second height $H_2$ may be between one-third to one-half of the standoff height $H_{so}$. Accordingly, if the desired standoff height $H_{so}$ is between about 30 μm and about 150 μm, such as about 100 μm, the second height $H_2$ may be between about 10 μm and about 70 μm, such as about 40 μm However, any suitable height may be utilized.

Once the buffer material 201 has been dispensed, the buffer material 201 may be cured in order to solidify the buffer material 201. In an embodiment in which the buffer material 201 is epoxy, the buffer material 201 may be cured at a temperature of between about 110 μm and about 150 μm, such as about 180 μm, for a time period of between about 10 s and about 2 hours, such as about 30 minutes. However, any suitable temperature (including room temperature) and any suitable time of curing may also be utilized.

Figure 3:
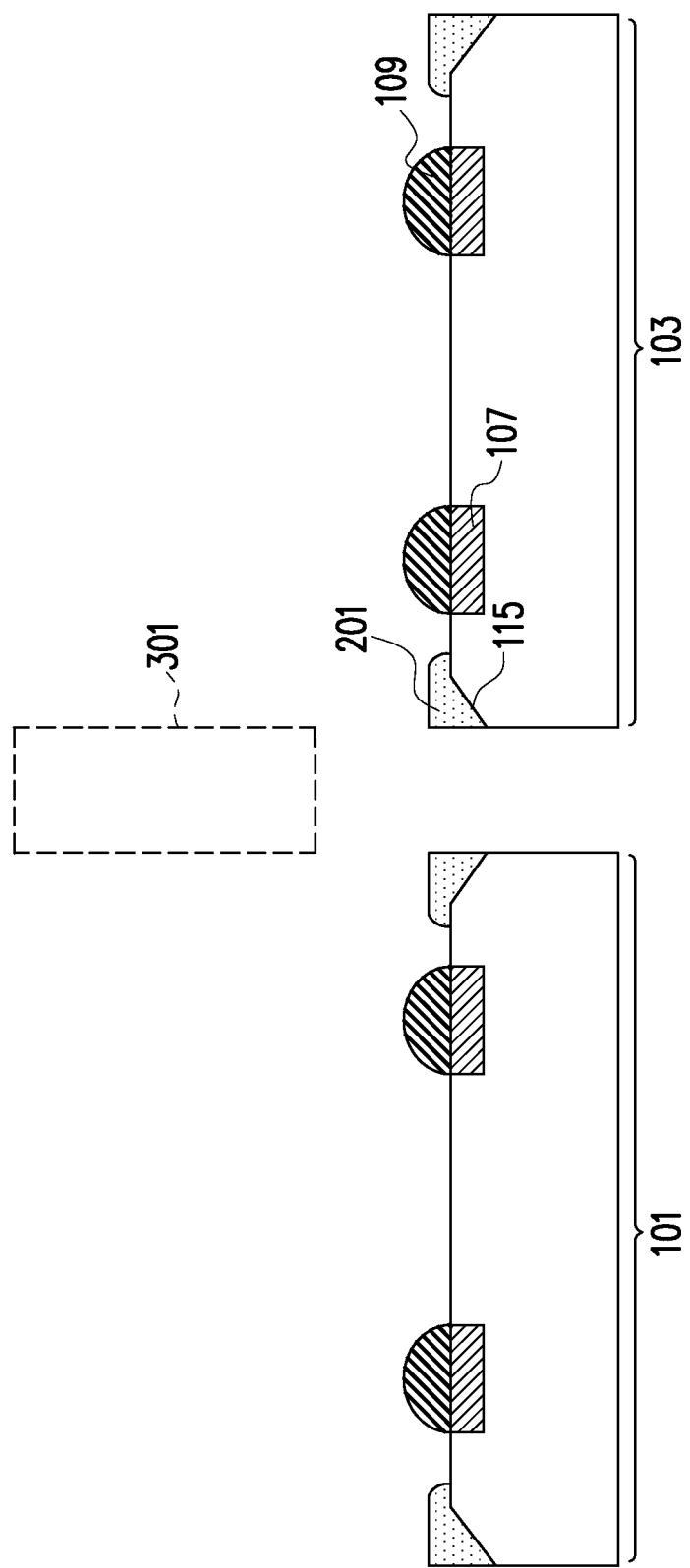
FIG. 3 illustrates a singulation of the wafer 100 in accordance with some embodiments.

FIG. 3 illustrates a second singulation process (represented in FIG. 3 by the dashed box labeled 301). In an embodiment the second singulation process 301 may be performed by using a saw blade to slice through the wafer 100 between the first semiconductor die 101 and the second semiconductor die 103. By slicing through the wafer 100 within the scribe region 105, the first semiconductor die 101 will be separated from the second semiconductor die 103 as well as the other remaining dies formed from and on the wafer 100.

While the second singulation process 301 separates the first semiconductor die 101 from the second semiconductor die 103, the second singulation process 301 will also cut through and remove material of the buffer material 201. As such, because both the buffer material 201 and the first semiconductor die 101 are sawed, the buffer material 201 will have an exterior sidewall that is aligned with and planar to a sidewall of the first semiconductor die 101 after the second singulation process 301 has occurred.

Additionally, while FIG. 3 illustrates the buffer material 201 and the first semiconductor die 101 aligned in a vertical direction, this is intended to be illustrative and is not intended to be limiting. Rather, any suitable orientation may be utilized. For example, if a saw blade with an angled edge is utilized, the buffer material 201 and at least a portion of the first semiconductor die 101 may be aligned with each other but at an angle to the vertical direction illustrated in FIG. 3. Any suitable orientation may be utilized.

Also, as one of ordinary skill in the art will recognize, utilizing a saw blade to singulate the first semiconductor die 101 is merely one illustrative embodiment and is not intended to be limiting. Alternative methods for singulating the first semiconductor die 101, such as utilizing one or more etches to separate the first semiconductor die 101 and the second semiconductor die 103, or even laser ablation may alternatively be utilized. These methods and any other suitable methods may alternatively be utilized to singulate the wafer 100.

Figure 4:
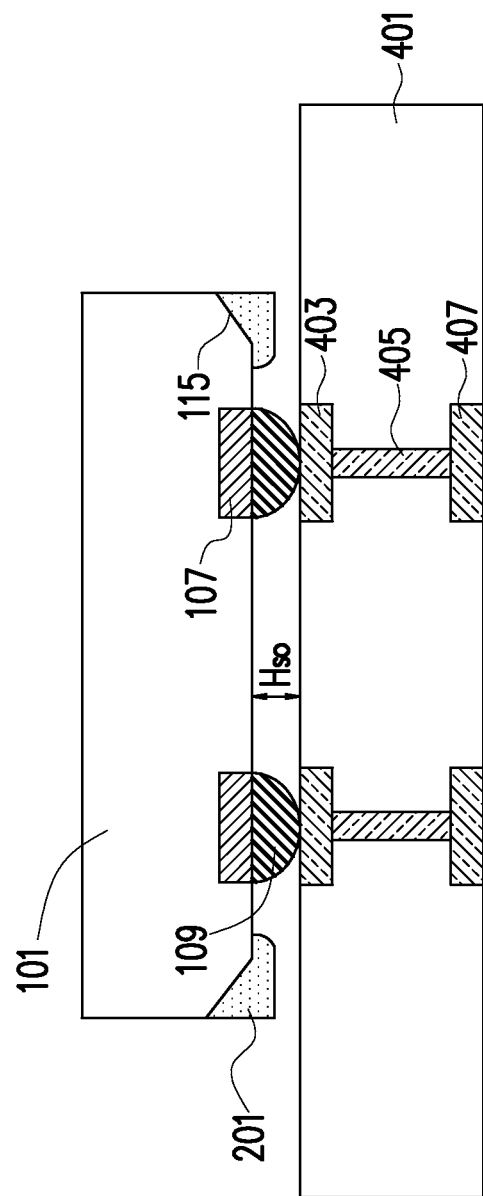
FIG. 4 illustrates a bonding of the first semiconductor device to a second substrate in accordance with some embodiments.

FIG. 4 illustrates that, once the first semiconductor die 101 has been singulated, the first semiconductor die 101 may be bonded to a second substrate 401. In an embodiment the second substrate 401 may comprise an interposer substrate (with multiple devices located within the interposer substrate) having one or more through vias 405, one or more second contact pads 403, and one or more third contact pads 407.

The second substrate 401 may have one or more redistribution layers (not separately illustrated) disposed on one or both sides of the second substrate 401. The one or more through vias 405 may comprise conductive material connecting the first RDL at the first side of the second substrate 401 to the second RDL at the second side of the second substrate 401. The RDLs may comprise dielectric layers with conductive lines which may be electrically connected to the one or more through vias 405. For example, the first RDL may connect one or more of the second contact pads 403 (on a first side of the second substrate 401) to one have one or more of the third contact pads 407 (on the second side of the second substrate 401) The third contact pads 407 may be used to connect the second substrate 401 (and, hence, the first semiconductor die 101) to a third substrate 601 (not illustrated in FIG. 4 but illustrated and described further below with respect to FIG. 6).

In an embodiment the second contact pads 403 and the third contact pads 407 may be similar to the contact pads 107 described above with respect to FIG. 1. For example, the second contact pads 403 and the third contact pads 407 may be a conductive material such as aluminum formed through a process such as CVD followed by patterning. However, in other embodiments the second contact pads 403 and the third contact pads 407 may be different from the contact pads 107 and each other.

In another embodiment the second substrate 401 may be another semiconductor wafer with additional semiconductor devices formed thereon. For example, the second substrate 401 may comprise a third semiconductor device (not separately illustrated) that is designed to work in conjunction with the first semiconductor die 101 but which has not yet been singulated from other semiconductor devices within the semiconductor wafer of the second substrate 401.

To bond the first semiconductor die 101 to the second substrate 401, the first external connections 109 are aligned with and placed into physical connection with the second contact pads 403 of the second substrate 401. Once in place, the temperature of the first external connections 109 is raised in order to initiate a reflow of the material of the first external connections 109. Once the reflow process has occurred and, afterwards, the material of the first external connections 109 has solidified, the first semiconductor die 101 is electrically and physically connected to the second substrate 401.

However, while the reflow process is described as one bonding process, this is intended to be illustrative and is not intended to be limiting. Rather, any suitable bonding process, such as copper-copper bonding in embodiments which utilize copper pillars, may also be utilized. All such bonding processes are fully intended to be included within the scope of the embodiments.

Once the first semiconductor die 101 and the second substrate 401 have been bonded together, the first semiconductor die 101 is separated from the second substrate 401 by the standoff height $H_{so}$. In an embodiment the standoff height $H_{so}$ may be between about 30 μm and about 150 μm, such as about 100 μm. However, any suitable standoff height may be utilized.

Figure 5:
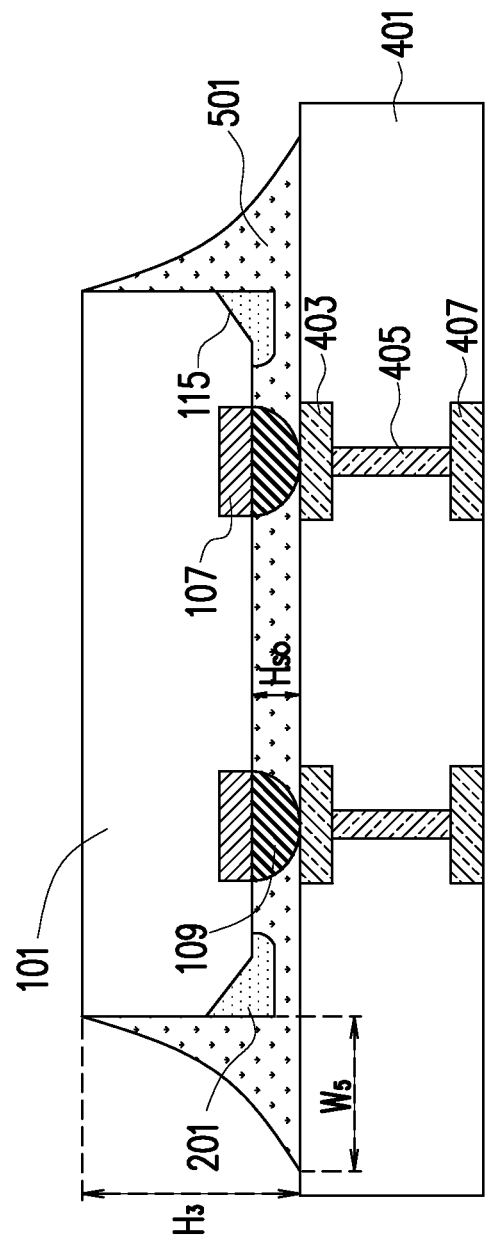
FIG. 5 illustrates a placement of an underfill in accordance with some embodiments.

FIG. 5 illustrates an application of the underfill material 501 between the first semiconductor die 101 and the second substrate 401 in order to help seal and protect the first external connections 109. In an embodiment the underfill material 501 may be an single, continuous material such as an epoxy, resin, or the like and may be dispensed by injecting the underfill material 501 in liquid form such that it flows between the first semiconductor die 101 and the second substrate 401. Once the underfill material 501 has been placed, the underfill material 501 may be cured in order to harden the underfill material 501.

In addition to sealing the first external connections 109, the underfill material 501 may also be dispensed to form fillets on each side of the first semiconductor die 101, thereby helping to seal and protect the sides of the first semiconductor die 101. In an embodiment the underfill material 501 may be dispensed until the fillet has a fifth width $W_5$ (extending away from the first semiconductor die 101) of less than about 2 mm, such as between about 1.5 mm to about 2 mm. Additionally, the fillet may have a third height $H_3$ that may or may not extend to cover all of the sidewall of the first semiconductor die 101. As such, the third height $H_3$ may be between about 700 mm and about 1000 mm. However, any suitable dimensions may be utilized.

Figure 6:
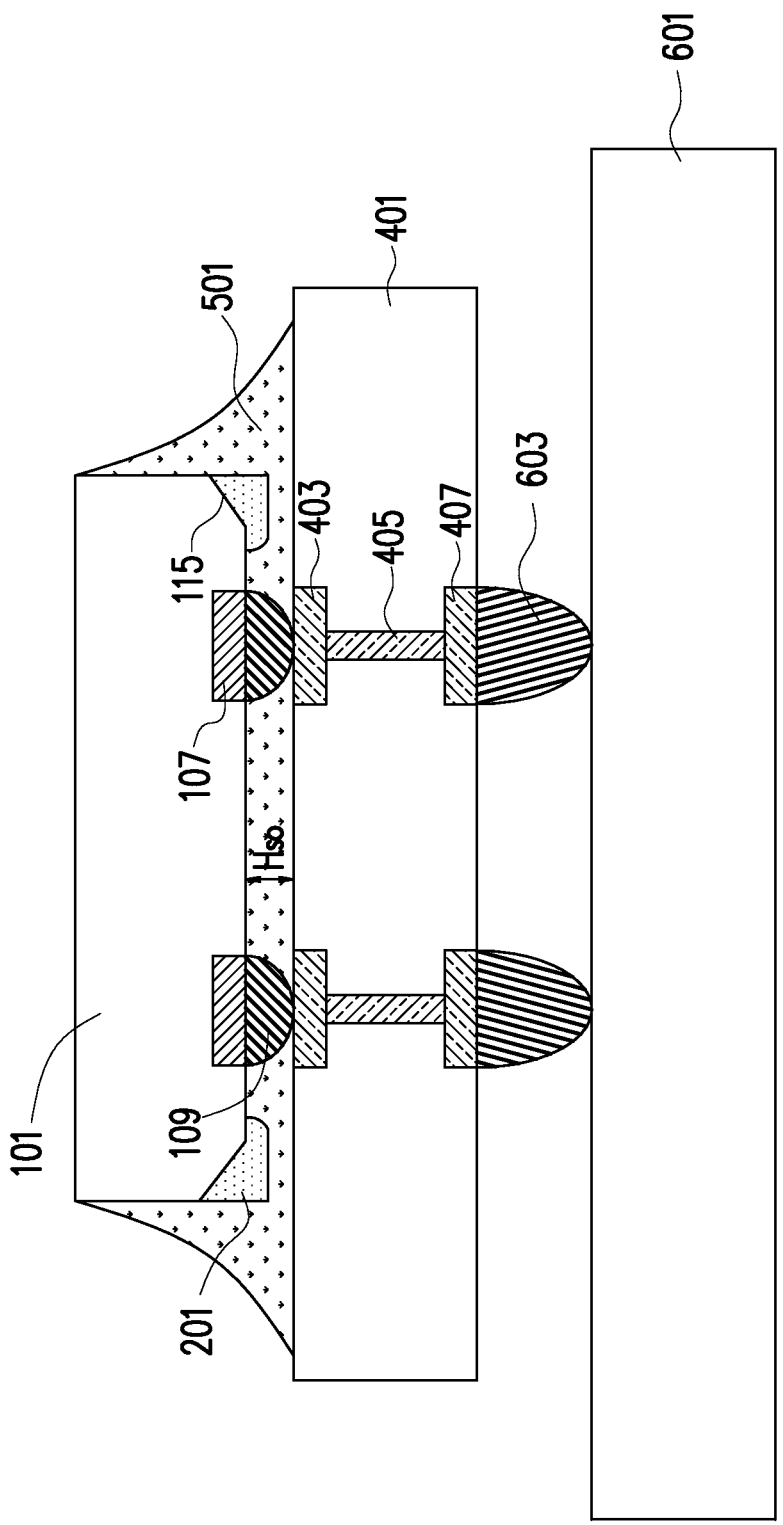
FIG. 6 illustrates a bonding of the second substrate to a third substrate in accordance with some embodiments.

FIG. 6 illustrates that, once the underfill material 501 has been placed between the first semiconductor die 101 and the second substrate 401, the second substrate 401 may be singulated and then bonded to a third substrate 601. In an embodiment the second substrate 401 may be singulated using one or more saw blades that separate the second substrate 401 into separate pieces. However, any suitable method of singulation, including laser ablation or one or more wet etches, may also be utilized.

Once singulated, the second substrate 401 and, hence, the first semiconductor die 101, are bonded to the third substrate 601 using, e.g., second external connectors 603. In an embodiment the second external connectors 603 may be contact bumps such as ball grid array bumps, microbumps, or controlled collapse chip connection (C4) bumps, and may comprise a material such as tin, or other suitable materials, such as silver or copper. In an embodiment in which the second external connectors 603 are tin solder bumps, the second external connectors 603 may be formed by initially forming a layer of tin through any suitable method such as evaporation, electroplating, printing, solder transfer, ball placement, etc, to a thickness of about 100 μm. Once a layer of tin has been formed on the structure, a reflow is performed in order to shape the material into the desired bump shapes.

Once the second external connectors 603 have been formed, the second substrate 401 is bonded to the third substrate 601 using the second external connectors 603. In an embodiment the third substrate 601 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity to the second substrate 401 are fully intended to be included within the scope of the embodiments.

The second substrate 401 may be bonded to the third substrate 601 by initially aligning the second substrate 401 with the third substrate 601 with the second external connectors 603 between corresponding contact pads. Once in physical contact, a reflow may be performed to reflow the second external connectors 603 and bond the second external connectors 603 with both the second substrate 401 and the third substrate 601. However, any other suitable bonding may alternatively be utilized.

By placing the buffer material 201 between the first semiconductor die 101 and the underfill material 501, the buffer material 201 can act as a buffer between the materials of the first semiconductor die 101 and the underfill material 501. As such, the negative effects from the differences in coefficients of thermal expansion, such as cracks, that could develop in the underfill material 501 can be reduced or eliminated. Such a reduction leads to an overall improvement in yield and reliability as well as an enlargement of the reliability window in embodiments which utilize a chip on wafer on substrate configuration.

Figure 7:
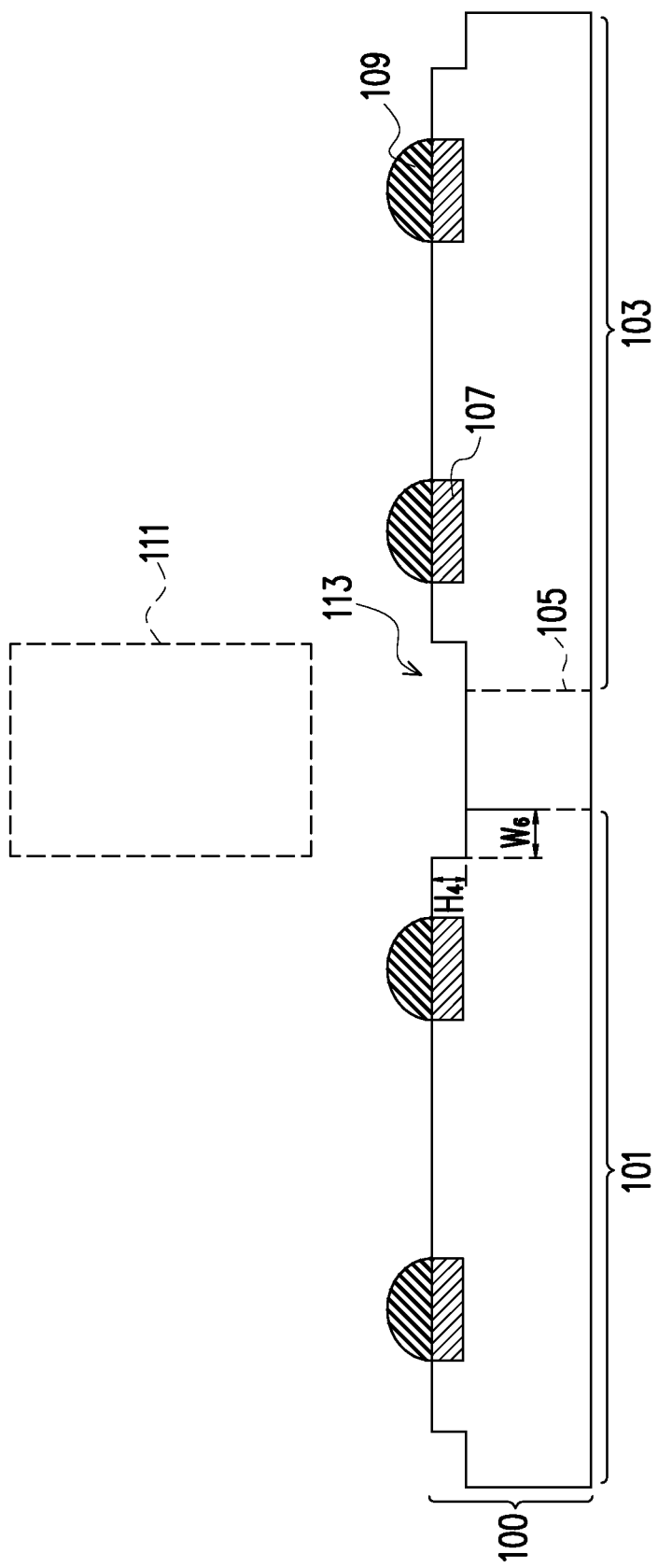
FIG. 7 illustrates an opening with a planar bottom surface in accordance with some embodiments.

FIG. 7 illustrates another embodiment in which the first opening 113, instead of having sloped sidewalls, has sidewalls that are perpendicular with the top surface of the first semiconductor die 101 and the second semiconductor die 103 and has a bottom surface which is planar and parallel with the top surface of the first semiconductor die 101. In this embodiment, rather than using an angled saw blade (as described above with respect to FIG. 1) for the first singulation process 111, the first opening 113 is formed using a saw blade with straight sides. In other embodiments which utilize a straight sidewall for the first opening 113, the first opening 113 may be formed using laser ablation or even one or more series of etches, such as dry etches, in order to remove material of the wafer 100 and form the first opening 113 to have the straight sidewalls. Any suitable method of forming the first opening 113 to have the straight sidewalls is fully intended be included within the scope of the embodiments.

In this embodiment the first opening 113 may be formed to have a fourth height $H_4$ of between about 10 μm and about 90 μm, such as about 20 μm. Additionally, the first opening 113 may also extend into the first semiconductor die 101 from the scribe region 105 a sixth width $W_6$ of between about 10 μm and about 90 μm, such as about 20 μm. However, any suitable dimensions may be utilized.

Figure 8:
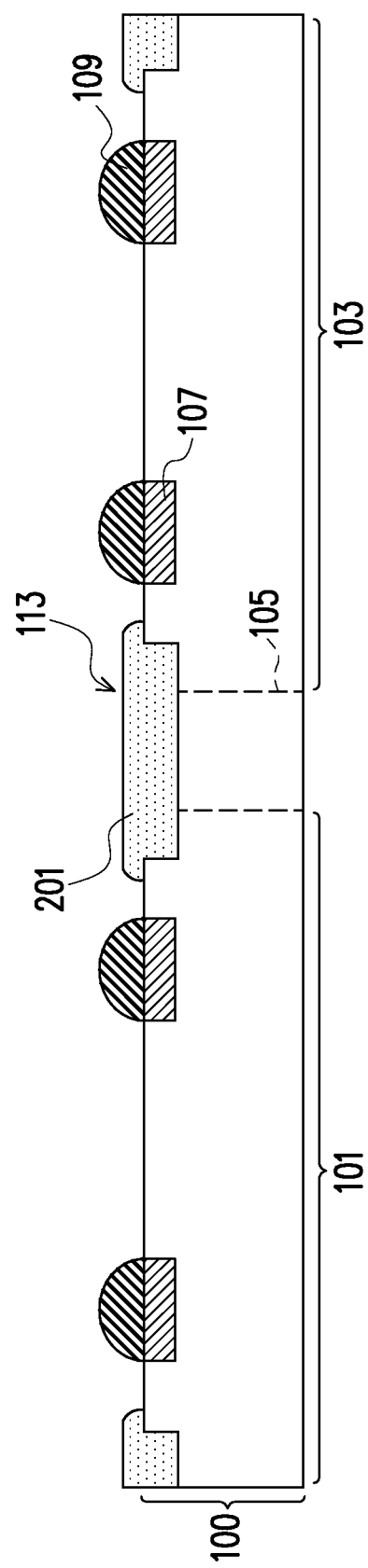
FIG. 8 illustrates a placement of the buffer material with a planar bottom surface in accordance with some embodiments.

FIG. 8 illustrates a placement of the buffer material 201 within the first opening 113 and at least partially overlying the first semiconductor die 101 and the second semiconductor die 103. In an embodiment the buffer material 201 may be placed as described above with respect to FIG. 2A. For example, the buffer material 201 may be dispensed in a liquid or flowable form around an outside edge of the first semiconductor die 101 and the second semiconductor die 103 (as described above with respect to FIG. 2B). However, the buffer material 201 may be dispensed in any suitable fashion.

In this embodiment, because the first opening 113 is formed to have straight sidewalls as well as a straight bottom surface, the buffer material 201 will also have a bottom surface that is straight and parallel with the top surface of the first semiconductor die 101. Additionally, the buffer material 201 will also have a sidewall that intersects the bottom surface at a right angle, forming the buffer material 201 into a stair step shape. However, any suitable shape may be utilized.

Figure 9:
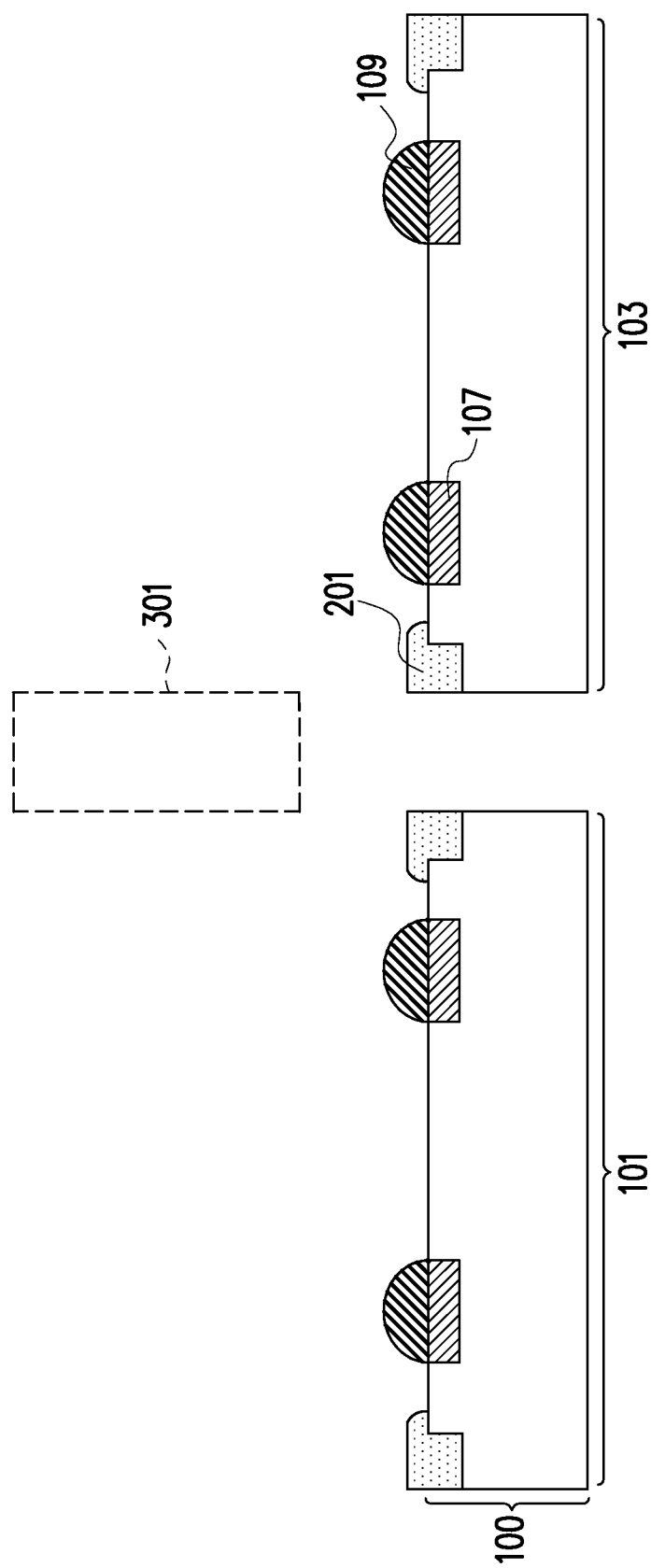
FIG. 9 illustrates a singulation of the wafer in accordance with some embodiments.

FIG. 9 illustrates a performance of the second singulation process 301 after the placement of the buffer material 201. In an embodiment the second singulation process 301 may be performed as described above with respect to FIG. 3. For example, a saw blade process, a laser ablation process, one or more wet etches, or the like may be utilized to separate the wafer 100 and separate the first semiconductor die 101 from the second semiconductor die 103. However, any suitable process may be utilized to singulate the wafer 100.

Additionally, because the buffer material 201 has a bottom surface that is parallel with the top surface of the first semiconductor die 101, the sidewall of the buffer material 201 formed by the second singulation process 301 (the sidewall facing the second semiconductor die 103) will not only be aligned with the sidewall of the first semiconductor die 101, but will also, in some embodiments, be perpendicular with the bottom surface of the buffer material 201. Such tuning of the shape of the bottom surface of the buffer material 201 allows for greater process variability and provides additional options for process integration.

Figure 10:
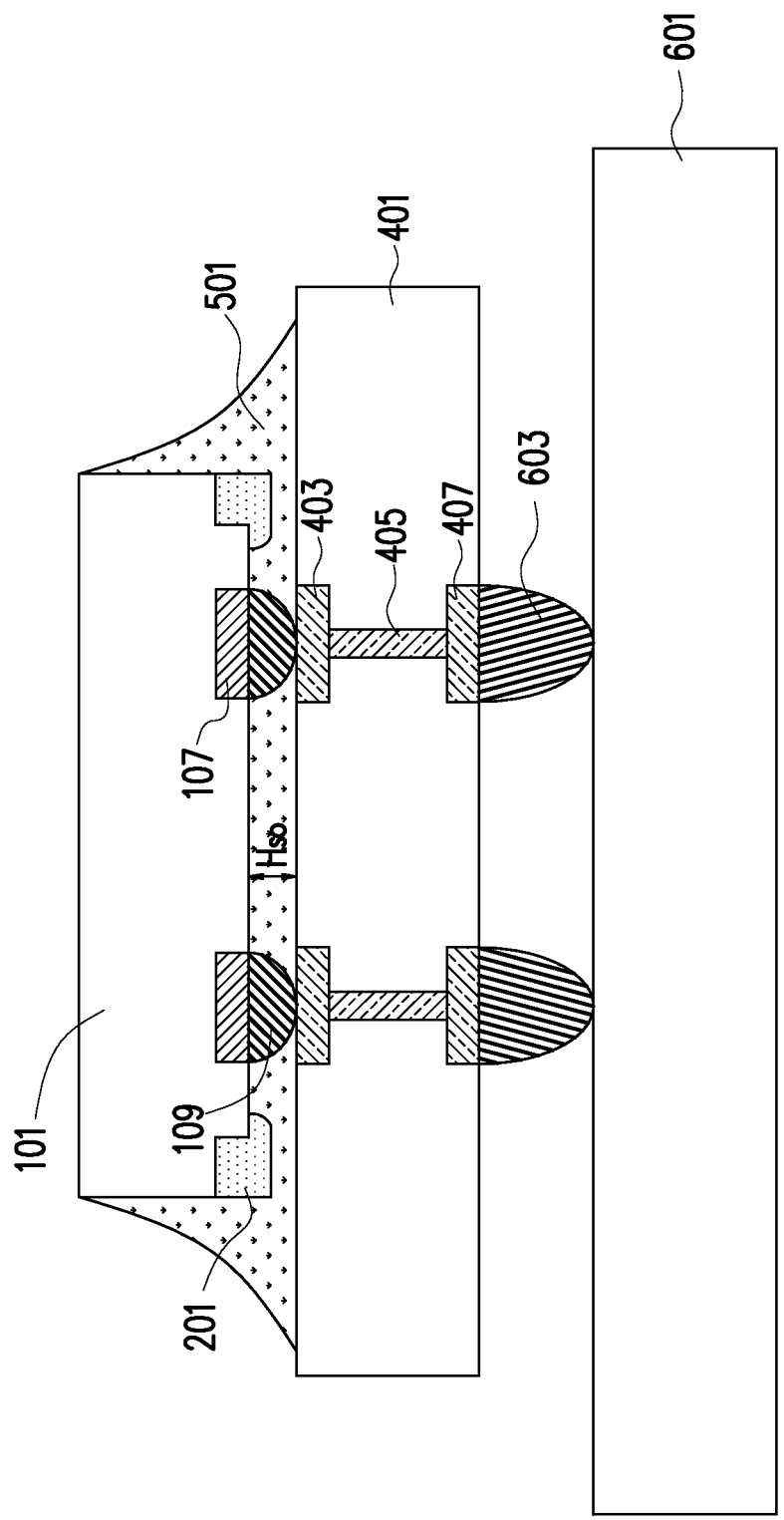
FIG. 10 illustrates a bonding of the first semiconductor die to a second substrate and a third substrate in accordance with some embodiments.

FIG. 10 illustrates a bonding of the first semiconductor die 101 to the second substrate 401, a placement of the underfill material 501 between the first semiconductor die 101 and the second substrate 401, and a bonding of the second substrate 401 to the third substrate 601. In an embodiment these process steps may be performed as described above with respect to FIGS. 4-6. However, any suitable process steps may be performed.

Figure 11:
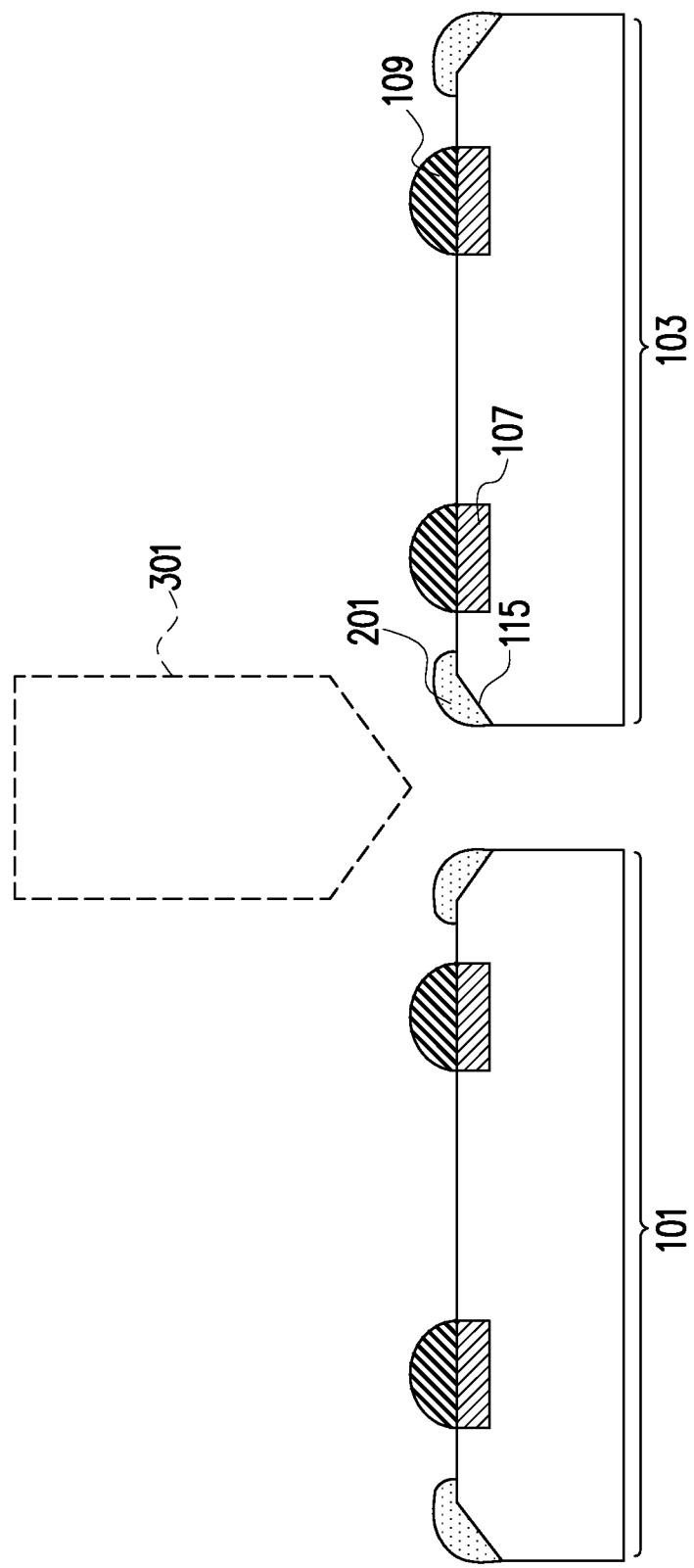
FIG. 11 illustrates a simultaneous singulation and corner rounding process in accordance with some embodiments.

FIG. 11 illustrates another embodiment in which the buffer material 201, instead of being squared off at the upper corner, has a curved shape. In this embodiment the corner of the buffer material 201 may be curved during the second singulation process 301 as described above with respect to FIG. 3. In this embodiment, however, instead of using a saw blade with straight sides, a saw blade with an angled side may be utilized. As such, the saw blade will remove material of the buffer material 201 in the shape of the saw blade, thereby rounding the upper corner of the buffer material 201.

In an embodiment the corner of the buffer material 201 may be curved away from a right angle such that the corner of the buffer material 201 has a first curvature. For example, the corner of the buffer material 201 may have a first curvature of between about 90 degrees and about 10 degrees, such as about 30 degrees. However, any suitable shape may be utilized.

Figure 12:
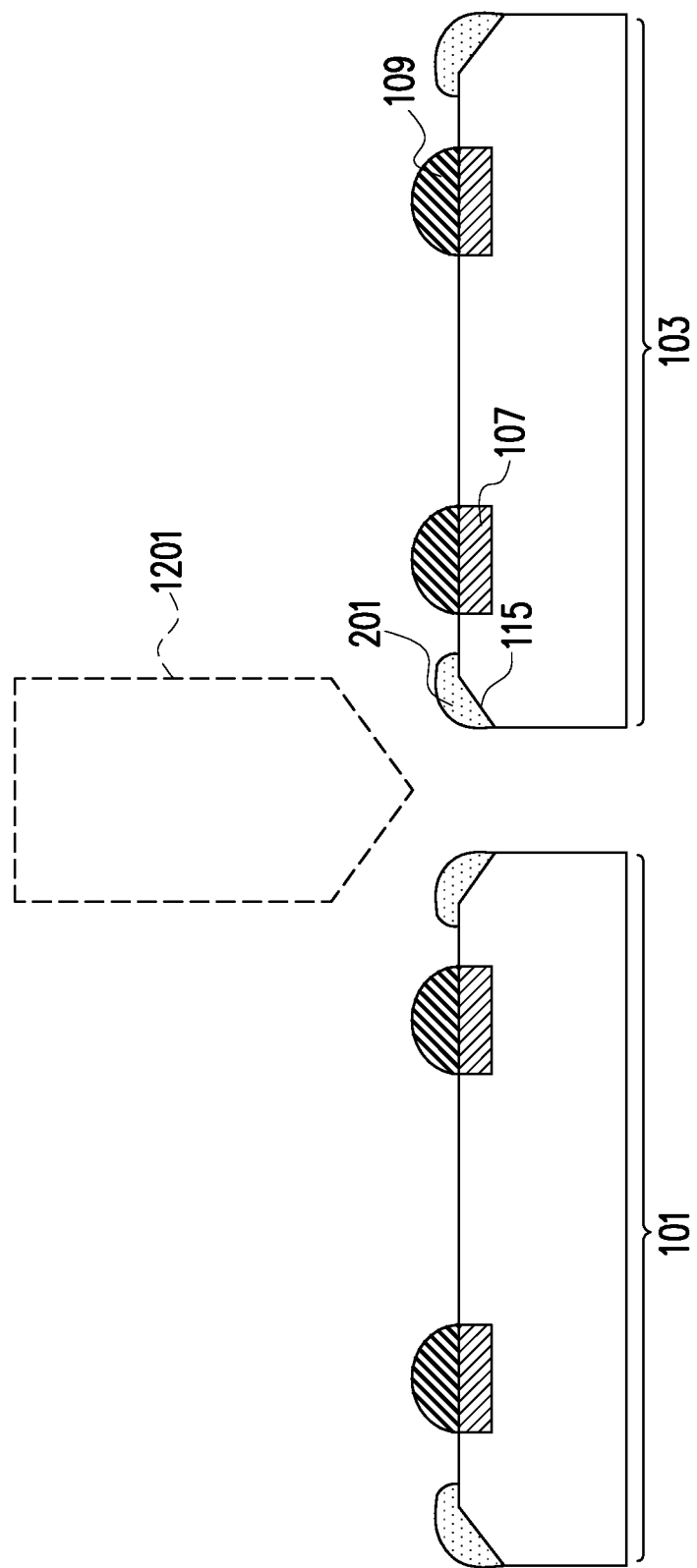
FIG. 12 illustrates a separate corner rounding process after a singulation process in accordance with some embodiments.

FIG. 12 illustrates another embodiment to form the rounded corners in the buffer material 201, in which, instead of using the second singulation process 301 to form the rounded corners, a separate rounding process (represented in FIG. 12 by the dashed box labeled 1201) is used to form the rounded corners. In an embodiment the rounding process 1201 may be a third singulation process performed after the second singulation process 301 which uses a shaped saw blade in order to remove material of the buffer material 201 and form the rounded corner. In another embodiment the rounded corner may be formed using a laser grooving process, whereby a laser is directed towards those portions of the buffer material 201 which are desired to be removed in order to form the rounded corners of the buffer material 201. Any suitable method for rounding the corners may be utilized to reshape the buffer material 201.

Figure 13A:
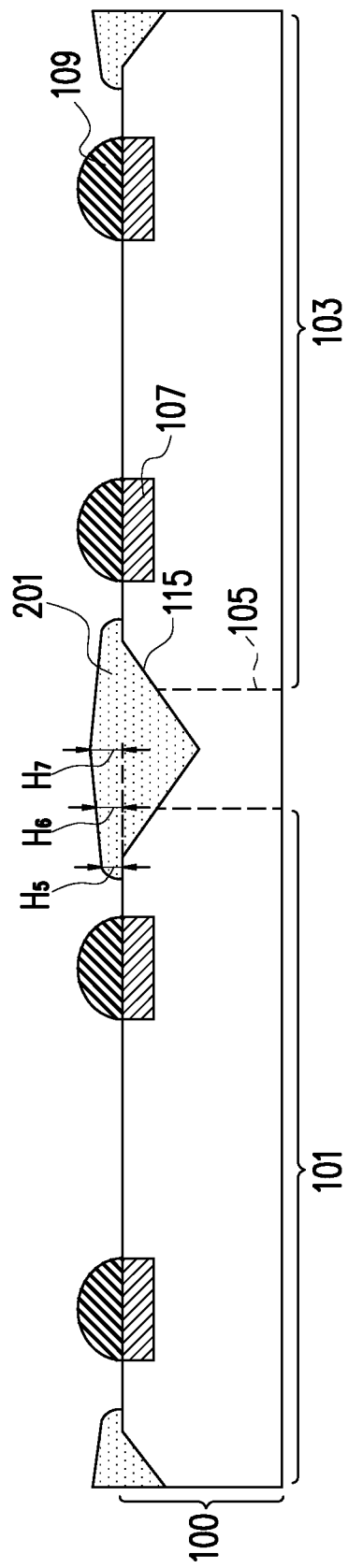
FIGS. 13A-13B illustrate a tuning of the shape of the buffer material in accordance with some embodiments.
Figure 13B:
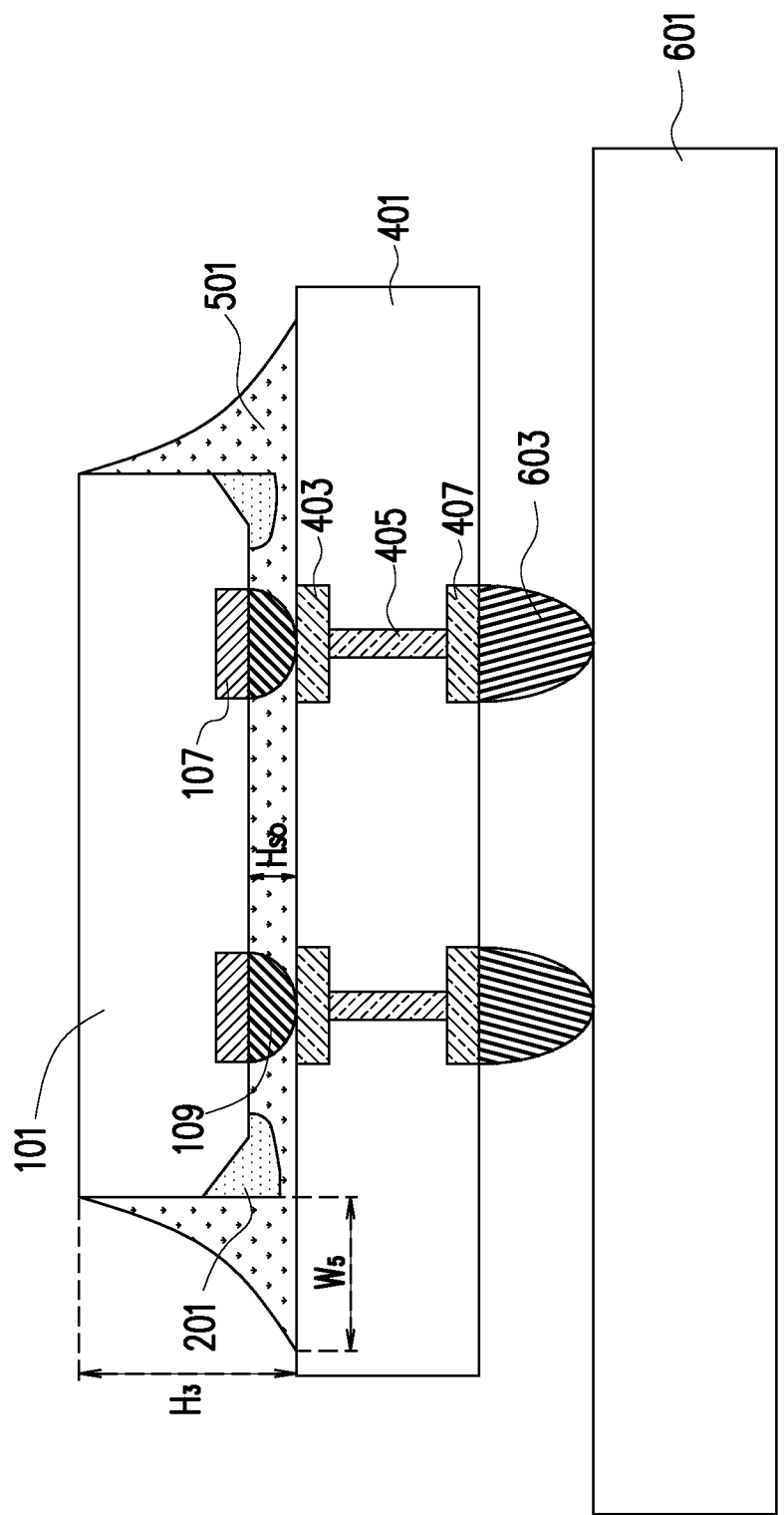

FIGS. 13A-13B illustrate yet another embodiment in which the shape of the buffer material 201 may be tuned away from having a planar top surface (as illustrated above with respect to FIG. 2A) and to have a top surface that is more rounded. In this embodiment, and as illustrated in FIG. 13A, the material of the buffer material 201 may be chosen in order to tune the shape of the buffer material 201 after it has been dispensed. For example, in one embodiment the material of the buffer material 201 may be chosen to have a higher hydrophobicity while in other embodiments the material of the buffer material 201 may be chosen to have a lower hydrophobicity, wherein the hydrophobicity modifies the shape of the buffer material 201. By tuning the hydrophobicity by choosing an appropriate material, the buffer material 201 may be tuned to have a top surface which is either more planar or else more rounded.

In a particular embodiment, the buffer material 201 is chosen to be a polymer such as acrylic, which has a hydrophobicity or hydrophilic of SiN. Given this chosen material and its properties, when the buffer material 201 is dispensed the buffer material 201 is pulled out of planarity and into a curved shape. As such, the buffer material 201 may have a fifth height $H_5$ at an edge of the buffer material 201 of between about 10 μm and about 70 μm, such as about 40 μm, and may also have a sixth height $H_6$ at a point over an edge of the scribe region 105 of between about 10 μm and about 100 μm, such as about 50 μm. Additionally, the buffer material 201 may have a seventh height $H_7$ at a midpoint of the buffer material 201 of between about 10 μm and about 150 μm, such as about 60 μm. However, any suitable dimensions may be utilized.

FIG. 13B illustrates that, after the material of the buffer material 201 has been chosen to tune the shape of the buffer material 201 to have a more rounded top surface, the wafer 100 may be singulated, the first semiconductor die 101 may be bonded to the second substrate 401, the underfill material 501 may be placed between the first semiconductor die 101 and the second substrate 401, and the second substrate 401 may be bonded to the third substrate 601. In an embodiment these process steps may be performed as described above with respect to FIGS. 4-6. However, any suitable process steps may be performed.

Figure 14:
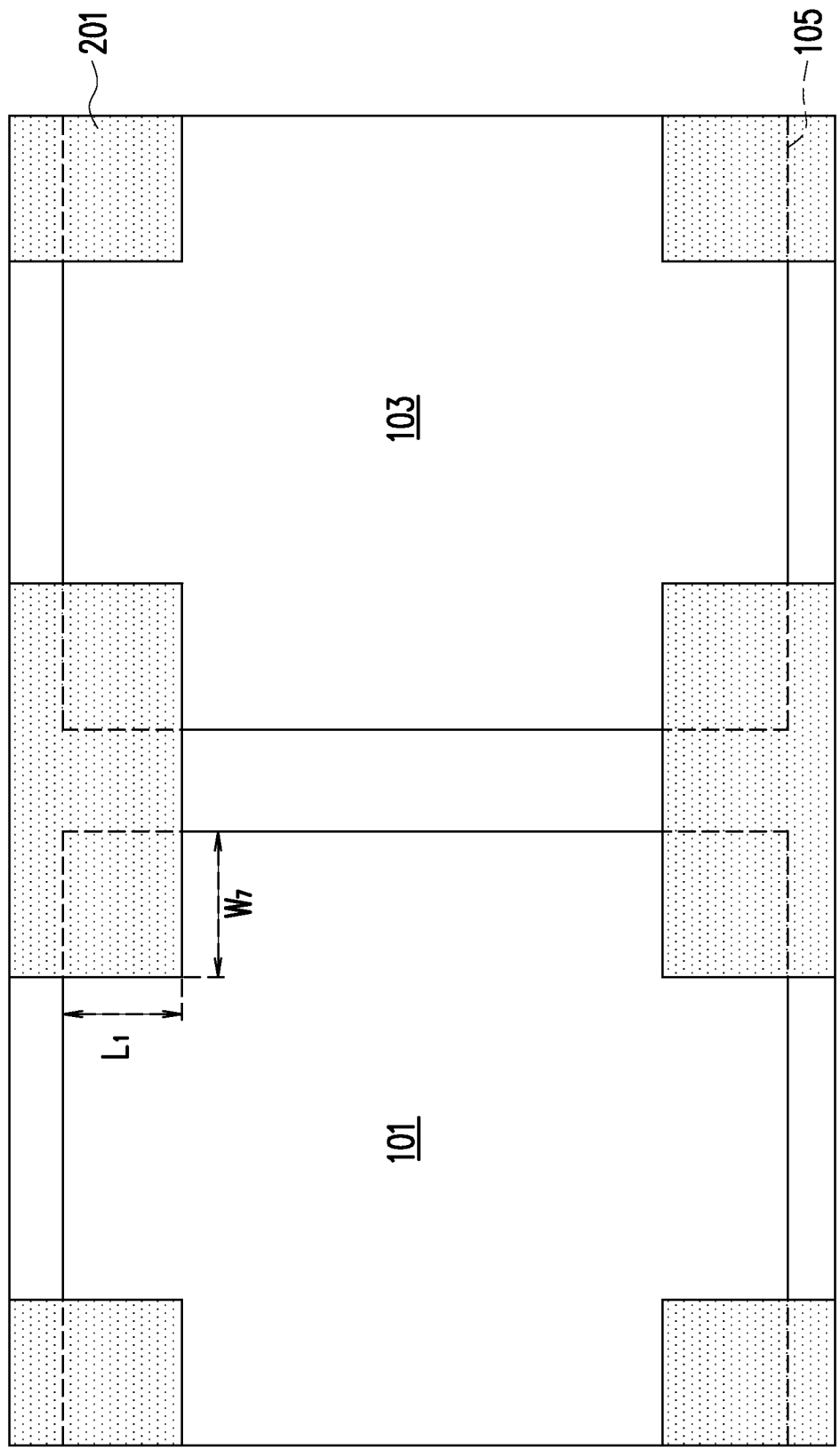
FIG. 14 illustrates a placement of the buffer material in corner regions of the semiconductor dies in accordance with some embodiments.

FIG. 14 illustrates yet another embodiment in which the buffer material 201, instead of being dispensed along the entire outside edge of the first semiconductor die 101 and the second semiconductor die 103, is dispensed only at the corners of the first semiconductor die 101 and at the corners of the second semiconductor die 103. In this embodiment the buffer material 201 may be dispensed such that the buffer material 201 over the first semiconductor die 101 has a seventh width $W_7$ of between about 100 μm and about 500 μm, such as about 200 μm. Additionally, the buffer material 201 may be dispensed such that the buffer material 201 has a first length $L_1$ of between about 100 μm and about 500 μm, such as about 200 μm. However, any suitable dimensions may be utilized.

By utilizing the buffer material 201 along the corners of the first semiconductor die 101 and the second semiconductor die 103, the buffer material 201 can provide the desired buffering to help prevent cracks along the corners, but a smaller amount of the buffer material 201 is utilized. Such a reduction of materials leads to an overall reduction in cost and helps to improve throughput.

Figure 15:
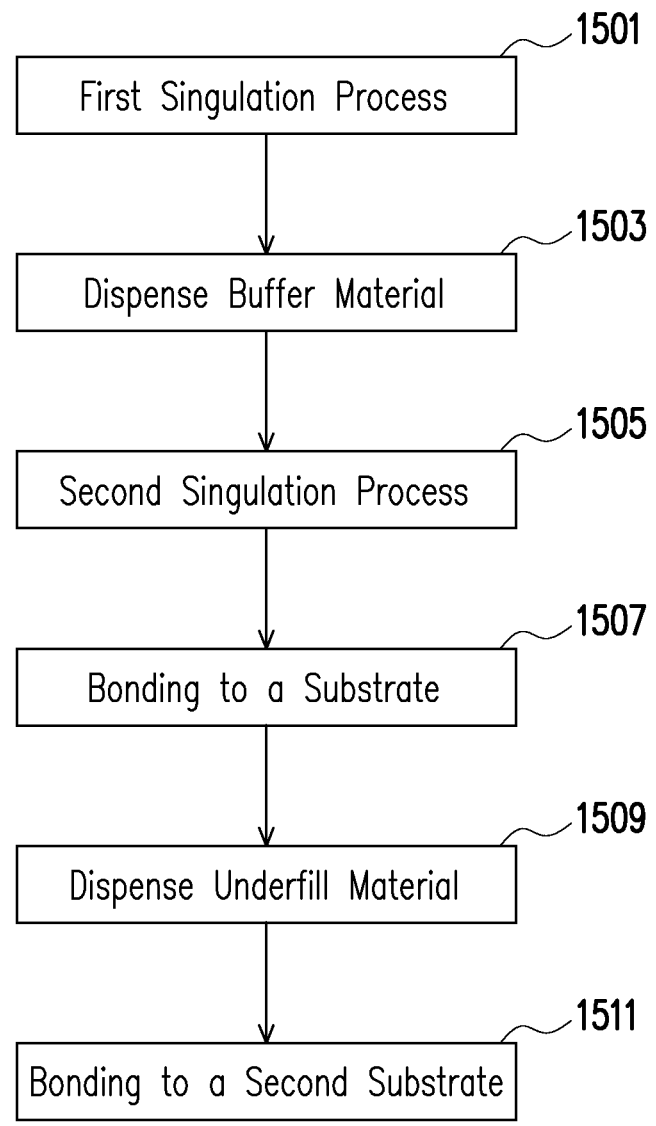
FIG. 15 illustrates a flow chart of a process in protecting semiconductor devices in accordance with some embodiments.

FIG. 15 illustrates a simplified flow chart that illustrates at least some of the process steps described herein. In an embodiment a first step 1501 includes performing a first singulation process and a second step 1503 includes dispensing a buffer material within an opening formed by the first singulation process. Once the buffer material has been dispensed and cured, a second singulation process is performed in a third step 1505 and, in a fourth step 1507, the singulated semiconductor die is bonded to a substrate. Once bonded, an underfill material is dispensed between the singulated semiconductor die and the substrate in a fifth step 1509, and the singulated combination is bonded to another substrate in a sixth step 1511.

In an embodiment, a method of manufacturing a device includes forming an opening along an outside edge of a semiconductor die; overfilling at least a portion of the opening with a buffer material; and placing an underfill material adjacent to the buffer material. In an embodiment, the method further includes singulating the semiconductor die from a semiconductor wafer after the overfilling the opening and before the placing the underfill material. In an embodiment, the singulating the semiconductor die is performed by slicing through the buffer material and the semiconductor wafer with a saw. In an embodiment, the method further includes bonding the semiconductor die to a first substrate prior to the placing the underfill material adjacent to the buffer material. In an embodiment, the underfill material flows between the first substrate and the buffer material during the placing the underfill material. In an embodiment, the method further includes bonding the first substrate to a second substrate. In an embodiment, the overfilling at least the portion of the opening with the buffer material leaves the buffer material along an entire perimeter of the semiconductor die.

In another embodiment a method of manufacturing a device includes partially singulating a first wafer to form a first opening within the first wafer, the first wafer comprising a semiconductor substrate of a first material, the first material having a first property with a first value, wherein the first opening extends at least partially into both a first semiconductor device and a second semiconductor device; filling at least a portion of the first opening with a buffer material, the buffer material having the first property with a second value different from the first value; fully singulating the first wafer after the filling the first opening, wherein after the fully singulating the first wafer the buffer material remains within the first opening over the first semiconductor device; bonding the first semiconductor device to a substrate; and dispensing an underfill material between the first semiconductor device and the substrate, wherein the underfill material has the first property with a third value, the second value being between the first value and the third value. In an embodiment, the partially singulating the first wafer forms the first opening to have a beveled edge. In an embodiment, the partially singulating the first wafer forms the first opening to have perpendicular sides. In an embodiment, the first property is Young's modulus. In an embodiment, the first property is a coefficient of thermal expansion. In an embodiment, the filling at least the portion of the first opening places the buffer material into corner regions of the first semiconductor device, wherein the buffer material does not extend beyond the corner regions of the first semiconductor device. In an embodiment, the method further includes rounding the buffer material after the filling at least the portion of the first opening.

In yet another embodiment a device includes a first semiconductor device, the first semiconductor device comprising a first external connection; a buffer material located along an outside edge of the first semiconductor device; and an underfill material extending from a sidewall of the first semiconductor device, around the buffer material, and to a point between the buffer material and the first external connection. In an embodiment, the underfill material is a continuous first material. In an embodiment, the buffer material extends at least partially into the first semiconductor device. In an embodiment, the buffer material has a beveled edge within the first semiconductor device. In an embodiment, the buffer material within the first semiconductor device has a first side parallel with a top surface of the first semiconductor device and a second side at an angle to the first side. In an embodiment, the buffer material within the first semiconductor device has a sidewall which connects to the sidewall of the first semiconductor device.

In yet another embodiment a method of manufacturing a device includes providing a semiconductor wafer with a first semiconductor device and a second semiconductor device; forming a first opening over a scribe region between the first semiconductor device and the second semiconductor device; dispensing a first material into the first opening; and removing a portion of the first material in a singulation process, wherein the singulation process separates the first semiconductor device from the second semiconductor device, the singulation process leaving a first portion of the first material over the first semiconductor device, the first portion having a width of less than 200 μm. In an embodiment, the removing the portion of the first material leaves behind a perpendicular corner. In an embodiment, the removing the portion of the first material leaves behind a rounded corner. In an embodiment, the forming the first opening forms a beveled edge.

In yet another embodiment a device includes a first semiconductor device comprising a top surface and a sidewall, wherein the top surface and the sidewall are connected by a first surface that is misaligned from the top surface and the sidewall; a buffer material in physical contact with the top surface and covering the first surface, wherein a second surface of the buffer material is aligned with the sidewall; and an underfill material in physical contact with the top surface and the buffer material. In an embodiment the buffer material has a stair step shape. In an embodiment the first surface is a beveled surface.

In yet another embodiment a device includes a semiconductor device with an opening located at a corner of the semiconductor device; a buffer material located at least partially within the opening, wherein the buffer material does not extend across the semiconductor device; a substrate bonded to the semiconductor device; and an underfill material located between the semiconductor device and the substrate, wherein the buffer material has a first property with a value located between a value of the semiconductor device and a value of the underfill material. In an embodiment the buffer material has a first sidewall that is aligned with a second sidewall of the semiconductor device. In an embodiment the buffer material has a rounded surface facing away from the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor device with an opening located at a corner of the semiconductor device;
   a buffer material located at least partially within the opening, wherein the buffer material does not extend across the semiconductor device;
   a substrate bonded to the semiconductor device; and
   an underfill material located between the semiconductor device and the substrate and also located between the buffer material and an external connection of the semiconductor device in a direction parallel with a surface of the substrate facing the semiconductor device, wherein the buffer material has a first property with a value located between a value of the semiconductor device and a value of the underfill material.

2. The device of claim 1, wherein the buffer material has a first sidewall that is aligned with a second sidewall of the semiconductor device.

3. The device of claim 1, wherein the buffer material has a rounded surface facing away from the semiconductor device.

4. The device of claim 1, wherein the value is a coefficient of thermal expansion.

5. The device of claim 1, wherein the value is a Young's modulus.

6. The device of claim 1, wherein the buffer material comprises epoxy.

7. A device comprising:
   a first semiconductor device comprising a top surface and a sidewall, wherein the top surface and the sidewall are connected by a first surface that is misaligned from the top surface and the sidewall;
   a buffer material in physical contact with the top surface and covering the first surface, wherein a second surface of the buffer material shares a plane with the sidewall, the buffer material and the first semiconductor device being on a same side of the plane; and
   an underfill material in physical contact with the top surface and the buffer material.

8. The device of claim 7, wherein the buffer material has a stair step shape.

9. The device of claim 7, wherein the first surface is a beveled surface.

10. The device of claim 7, wherein the first surface extends away from the top surface at an angle of between about 20° and about 40°.

11. The device of claim 7, wherein the sidewall is separated from the top surface by a first distance in a first direction of between about 20 μm and about 200 μm.

12. The device of claim 11, wherein the sidewall is separated from the top surface by a second distance in a second direction of between about 20 μm and about 200 μm, the second direction being perpendicular to the first direction.

13. The device of claim 7, wherein the buffer material has a height over the top surface of between about 10 μm and about 70 μm.

14. The device of claim 7, further comprising a substrate bonded to the first semiconductor device at a first standoff distance, wherein a height of the buffer material is between one-third and one-half of the first standoff distance.

15. A device comprising:
    a first semiconductor device, the first semiconductor device comprising a first external connection;
    a buffer material located along an outside edge of the first semiconductor device; and
    an underfill material extending from a sidewall of the first semiconductor device, around the buffer material, and to a point between the buffer material and the first external connection, the buffer material being fully embedded within the underfill material.

16. The device of claim 15, wherein the underfill material is a continuous first material.

17. The device of claim 15, wherein the buffer material extends at least partially into the first semiconductor device.

18. The device of claim 17, wherein the buffer material has a beveled edge within the first semiconductor device.

19. The device of claim 17, wherein the buffer material within the first semiconductor device has a first side parallel with a top surface of the first semiconductor device and a second side at an angle to the first side.

20. The device of claim 17, wherein the buffer material within the first semiconductor device has a sidewall which connects to the sidewall of the first semiconductor device.

* * * * *

UNITED STATES PATENT AND TRADEMARK OFFICE
CERTIFICATE OF CORRECTION

PATENT NO. : 11,201,097 B2
APPLICATION NO. : 16/569972
DATED : December 14, 2021
INVENTOR(S) : Huang et al.

Page 1 of 1

It is certified that error appears in the above-identified patent and that said Letters Patent is hereby corrected as shown below:

In the Claims

Claim 10, Column 14, Line 19; delete "20° and about 40°" and insert --20° and about 45°--.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*